(12) United States Patent
Hirai

(10) Patent No.: US 7,282,940 B2
(45) Date of Patent: Oct. 16, 2007

(54) SEMICONDUCTOR DEVICE WITH ELECTRODE PADS FOR TEST PROBE

(75) Inventor: Miho Hirai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/094,673

(22) Filed: Mar. 31, 2005

(65) Prior Publication Data

US 2005/0218916 A1  Oct. 6, 2005

(30) Foreign Application Priority Data

Mar. 31, 2004  (JP)  ............... 2004-102048

(51) Int. Cl.
*G01R 31/26*  (2006.01)

(52) U.S. Cl. ............... 324/765; 324/758; 324/763

(58) Field of Classification Search ............ None
See application file for complete search history.

(56) References Cited

U.S. PATENT DOCUMENTS 5,554,940 A * 9/1996 Hubacher ............... 324/765
5,900,643 A * 5/1999 Preslar et al. ............ 257/48
6,008,061 A * 12/1999 Kasai ..................... 438/18
6,429,532 B1 * 8/2002 Han et al. ............... 257/781
6,937,047 B2 * 8/2005 Tran et al. ............... 324/763

FOREIGN PATENT DOCUMENTS

JP  2002-329742  11/2002

* cited by examiner

*Primary Examiner*—Minh N. Tang
(74) *Attorney, Agent, or Firm*—Young & Thompson

(57) ABSTRACT

A semiconductor device includes a plurality of I/O regions provided in a peripheral region of the semiconductor device. Each of the plurality of I/O regions includes an electrode pad. The electrode pad has a test probe area and a bonding area which are separately provided, and a test probe is made to contact the test probe area and an external electrode is connected to the bonding area. The semiconductor device may have a multi-layer wiring structure, and the electrode pad connected to the multi-layer wiring structure. An uppermost wiring layer of the multi-layer wiring structure may be arranged in a region other than a region directly under the test probe area.

9 Claims, 15 Drawing Sheets

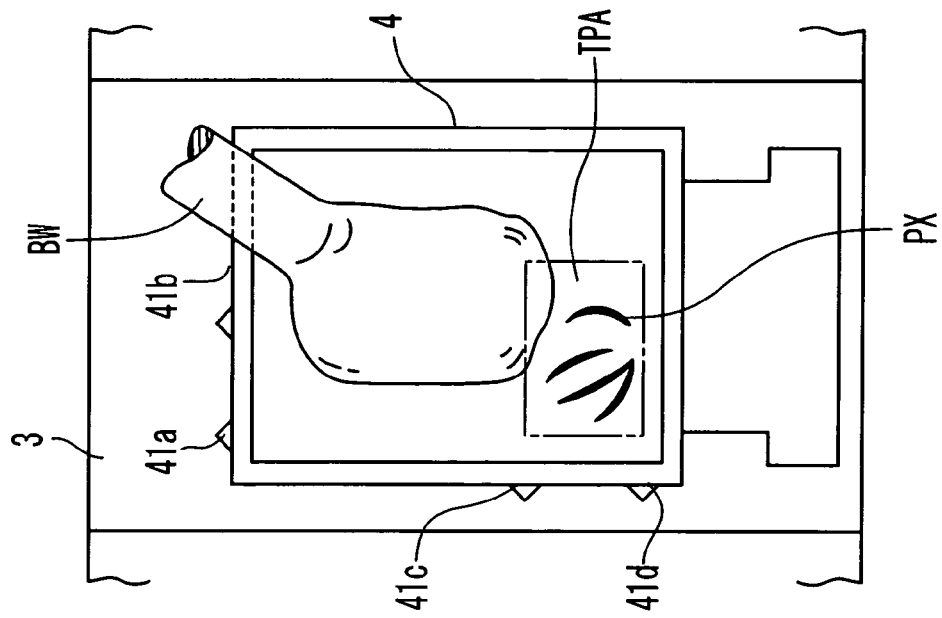
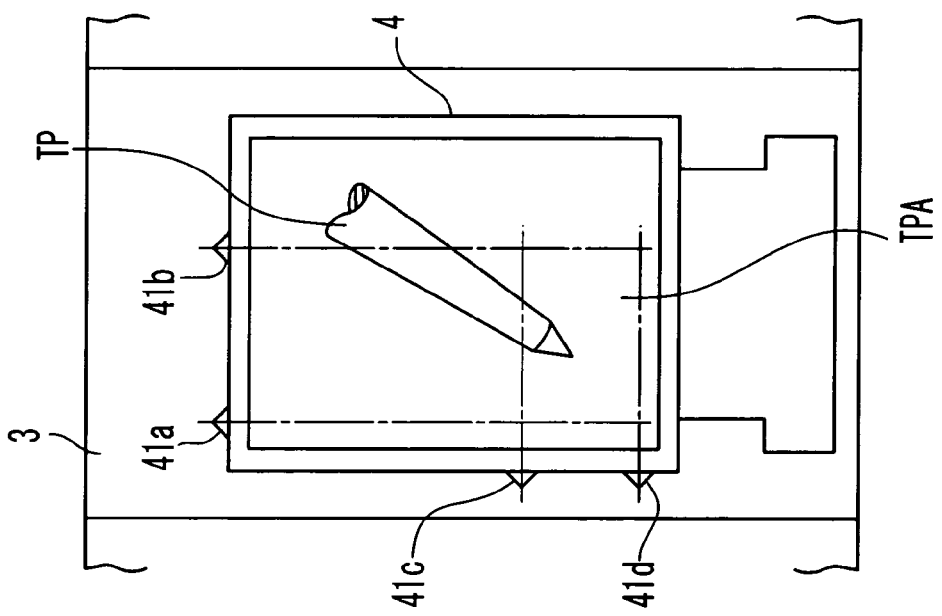

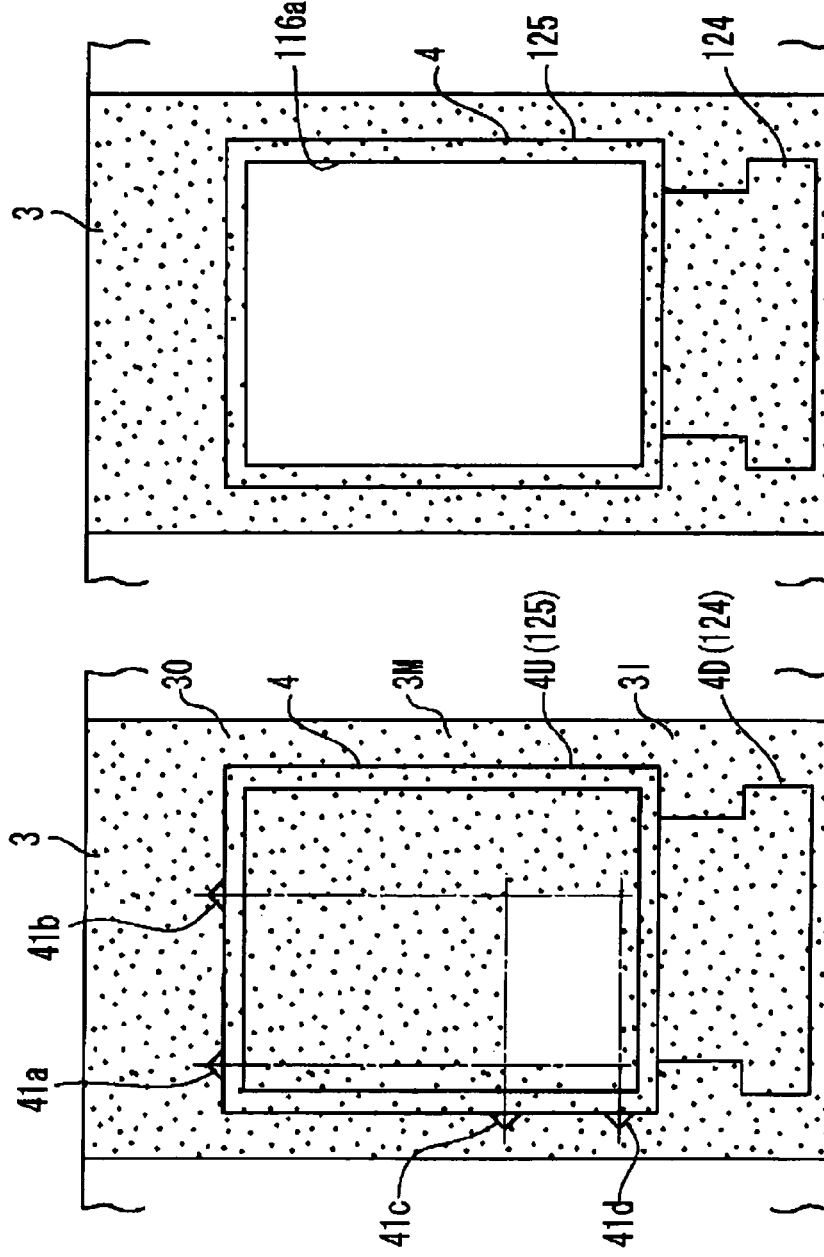

SEMICONDUCTOR DEVICE WITH ELECTRODE PADS FOR TEST PROBE

BACKGROUND OF THE INVENTION

1. Field of the Invention

The present invention relates to a semiconductor device having an electrode pad for an external connection.

2. Description of the Related Art

In a chip-formed semiconductor device provided on the semiconductor substrate, a so-called probing is carried out for an electrical characteristic inspection, in which a test probe is made to contact an electrode pad provided for the semiconductor device so that electric power and/or signals are supplied to the semiconductor device. In such a semiconductor device, a stress caused by the contact influences an insulating layer as a lower layer of the electrode pad of aluminum when the test probe is pushed against the surface of the electrode pad, so that a crack is sometimes generated in the insulating layer. The crack deteriorates the insulation of a wiring circuit provided under the lower layer and causes a leakage. As a result, the reliability of the semiconductor device reduces. It is difficult to recognize the crack and to regard the semiconductor device as a defective device only by observing the semiconductor device from the surface since the crack is generated in the lower layer of the electrode pad.

In the conventional semiconductor device, the positioning of the test probe on the electrode pad is determined manually, or automatically by an automatic machine to recognize the electrode pad. However, the positioning of the contact is not limited to a specific region of the electrode pad. Therefore, the test probe possibly contacts the almost whole region of the electrode pad due to a fluctuated operation of the operator and the automatic machine. In order to prevent the defect of the wiring circuit in the lower layer of the electrode pad, the wiring circuit is not provided directly under the electrode pad in the conventional semiconductor device. That is, in the conventional semiconductor device, it is tried to prevent the leakage in the wiring circuit even when the crack is generated in the insulating layer as the lower layer of the electrode pad upon the contact of the test probe, so as to secure the reliability of the semiconductor device.

FIG. 3 is a general view of a layout of an electrode pad. Referring to the semiconductor device shown in FIG. 3, for instance, the electrode pads 4 are provided in I/O (input and output) circuit regions 3 that are arranged in the outer periphery of an internal circuit 2 of a semiconductor chip 1. FIG. 1 shows an outline layout of the electrode pad in the conventional semiconductor device. FIG. 2 is a schematic cross sectional view of the semiconductor device along the C-C line in FIG. 1. A multi-layer interconnection structure is provided on the I/O circuit region 3. That is, an element 105 such as a MOS transistor is formed on the semiconductor substrate 101. First to third metal wiring layers 121, 122, and 123 are laminated above the element 105 through first to third interlayer insulating layers 111, 112, and 113, respectively. First to third via-contacts 131, 132, and 133 connect between the MOS transistor and the first to third metal wiring layers 121, 122, and 123. In this example, an electrode pad 4 is formed to have a CUP (Circuit Under Pad) structure that is made from two metal wiring layers as upper and lower layers. A fourth metal wiring layer 124 as a lower layer pad 4D and a fifth metal wiring layer 125 as an upper layer pad 4U are laminated on the multi-layer interconnection structure, a fifth interlayer insulating layer 115 on the fourth interlayer insulating layer 114. A fourth via-contact 134 connects the third metal wiring layer 123 with the fourth metal wiring layer 124, and the fourth metal wiring layer 124 and the fifth metal wiring layer 125 are electrically and mechanically connected each other via a fifth via-contact 135. A surface insulating layer 116 covers the fifth metal wiring layer 125. Here, a part of the surface of the fifth metal wiring layer 125 is exposed in an opening 116a of the surface insulating layer 116, and functions as a pad.

In the conventional electrode pad, in order to prevent the leak beforehand in the insulating layer directly under the electrode pad 4 due to a crack CX generated upon the contact of the test probe TP with the electrode pad 4, the third metal wiring layer 123 as the uppermost layer, which especially easily receives a large influence from the crack, is not provided directly under the electrode pad 4, as shown in FIG. 2 by a chain line. That is, the periphery of the electrode pad 4 is covered with the surface insulating layer 116 by a predetermined width, and the surface of the electrode pad 4 is exposed in the opening 116a provided on the surface insulating layer 116. The test probe TP is made to contact the above-mentioned surface of the exposed electrode pad 4. The third metal wiring layer 123 is not only not provided directly under the region of the surface of the exposed electrode pad 4, but also not provided under a slightly wider region in consideration of manufacturing deviation (the region P in FIG. 2). Therefore, the region where the third metal wiring layer 123 is provided in the I/O circuit region 3 is shown in FIG. 8B by dots. Thus, the region where the third metal wiring layer 123 is provided in the I/O circuit region 3 is limited to the region in the both end portions in the Y direction of the I/O circuit region 3 and the along the both sides in the X direction of the I/O circuit region 3.

Moreover, a so-called probe flaw (probe trace) is generated on the surface of the electrode pad 4 upon the contact of the test probe TP to the surface of the electrode pad 4 (not shown). Especially, a plurality of the probe flaws are sometimes produced when the test probe is repeatedly made to contact the same electrode pad. If a bonding is carried out to such an electrode pad with the probe flaws to connect an external electrode such as a gold fine wiring and a tape lead, a substantial contact area of an external electrode and the electrode pad is decreased due to the probe flaws on the surface of the electrode pad. The decrease of the substantial contact area causes the reduction of the reliability of the bonding. Furthermore, an alloy of aluminum and gold is formed on a contact surface of the electrode pad in order to bond the gold wire on the electrode pad to aluminum with a supersonic wave. In this case, the contact area is decreased due to the probe flaw, and the bond strength is reduced and the gold wire comes off easily.

Japanese Laid Open Patent Application (JP-P 2002-329742A) discloses a conventional example to solve such reduction of the bonding strength due to the probe flaw. In the conventional example, two kinds of the electrode pads are formed, one is for the test that the test probe is made to contact the pad, and the other is for the bonding. The bonding is carried out on the electrode pad for bonding. Thus, even if the probe flaw is generated on the electrode pad for the test due to the contact with the test probe, the bonding with high strength can be achieved without getting influence of the probe flaw.

It is effective to improve the bonding strength of the electrode pad as show in the above-mentioned conventional example that the electrode pads for the test and for the bonding are provided separately. However, according to the above example, it is inevitable that an area of the semiconductor device occupied by the electrode pads is increased so that the chip area is increased. The increase of the area becomes an impediment to achieve the high integration of the semiconductor device. Especially, in recent years, the number of the electrode pads tends to increase according to a multi-function of the semiconductor device. Therefore, the above-mentioned conventional example is restricted due to increase in the number of the electrode pads and has a difficulty to response to the multi-function of the semiconductor device.

In the conventional electrode pad shown in FIGS. 1 and 2, the third metal wiring layer 123 as a directly under layer metal wiring layer in the I/O circuit region 3 cannot be provided directly under the region of the electrode pad 4. Therefore, the wiring possible area is limited in the I/O circuit region 3. Especially, when the increase of the number of electrode pads according to the multi-function of the semiconductor device, so that the number of the I/O circuit regions increases to reduce the area of the single I/O circuit region. As a result, the wiring possible area is further decreased, and flexibility of wiring design is also reduced in the I/O circuit region, so that a desirable circuit configuration of the I/O circuit region cannot be achieved. Consequently, it is difficult for the high integration of the semiconductor device.

SUMMARY OF THE INVENTION

In an aspect of the present invention, a semiconductor device includes a plurality of I/O regions provided in a peripheral region of the semiconductor device. Each of the plurality of I/O regions includes an electrode pad. The electrode pad has a test probe area and a bonding area which are separately provided, and a test probe is made to contact the test probe area and an external electrode is connected to the bonding area.

The semiconductor device may have a multi-layer wiring structure, and the electrode pad connected to the multi-layer wiring structure. An uppermost wiring layer of the multi-layer wiring structure may be arranged in a region other than a region directly under the test probe area.

Also, the test probe area may be defined based on probe area makers. In this case, the electrode pad may have a 2-layer structure of an upper pad and a lower pad connected with the upper pad.

In this case, the probe area markers may be provided for the lower pad.

Two of the probe area markers may be provided for a specific side of the lower pad along an external side of the semiconductor device, and two of the probe area markers may be provided for one of sides of the lower pad orthogonal to the specific side.

Also, one of the probe area markers may be provided for a specific side of the lower pad along an external side of the semiconductor device, and one of the probe area markers may be provided for one of sides of the lower pad orthogonal to the specific side.

Also, two of the probe area markers may be provided for a specific side of the lower pad opposing to an external side of the semiconductor device, and two of the probe area markers may be provided for one of sides of the lower pad orthogonal to the specific side.

Also, two of the probe area markers may be provided for two of sides of the lower pad orthogonal to a side of the lower pad along to an external side of the semiconductor device, respectively.

Also, when the probe area markers are provided for a wiring layer containing the lower pad, two of the probe area markers my be provided for one of sides of the lower pad orthogonal to a side of the lower pad along to an external side of the semiconductor device. In addition, two of the probe area markers may be provided for a wiring line provided in a neighborhood of the lower pad.

Also, the probe area markers may be protrusions extending in a direction from the lower pad to an adjacent electrode pad.

Also, the electrode pad may have a single layer structure. In this case, two of the probe area markers may be provided for a specific side of the electrode pad along an external side of the semiconductor device, and two of the probe area markers may be provided for one of sides of the lower pad orthogonal to the specific side.

Also, the probe area markers may be protrusions extending in a direction from the lower pad to an adjacent electrode pad. Instead, the probe area markers may be notches provided for the electrode pad.

Also, the probe area markers are preferably visible from above the semiconductor device.

In another aspect of the present invention, an inspection method of a semiconductor device is achieved by forming a semiconductor device which has a multi-layer wiring structure, and an electrode pad connected to the multi-layer wiring structure, wherein each of a plurality of I/O regions provided in a peripheral region of the semiconductor device, comprises the electrode pad. The inspection method is achieved by further positioning a test probe in a test probe area, the electrode pad having the test probe area and a bonding area, which are provided separately; by testing whether the semiconductor device is good or defective, by using the test probe; and by bonding an external electrode to the bonding area of the electrode pad of the semiconductor device which is determined to be good.

Here, the inspection method may be achieved by further determining whether the semiconductor device is good or defective, based on whether a result of the positioning is within the test probe area.

Also, the determining may be carried out by viewing the electrode pad.

Also, the positioning may be achieved by manually or automatically positioning the test probe.

BRIEF DESCRIPTION OF THE DRAWINGS

FIG. 7A is a diagram showing a state that a test probe TP is made to contact the electrode pad for an electrical inspection of the semiconductor chip in the first embodiment;

FIG. 7B is a diagram showing a contact flaw PX generated when the test probe TP is pushed against the surface of the electrode pad in the semiconductor chip in the first embodiment;

FIGS. 8A and 8B are diagrams showing a wiring region in the electrode pad of the first embodiment and a wiring region in the conventional electrode pad shown in FIG. 1;

DESCRIPTION OF THE PREFERRED EMBODIMENTS

Hereinafter, a semiconductor device of the present invention will be described in detail with reference to the attached drawings.

First Embodiment

Figure 3:
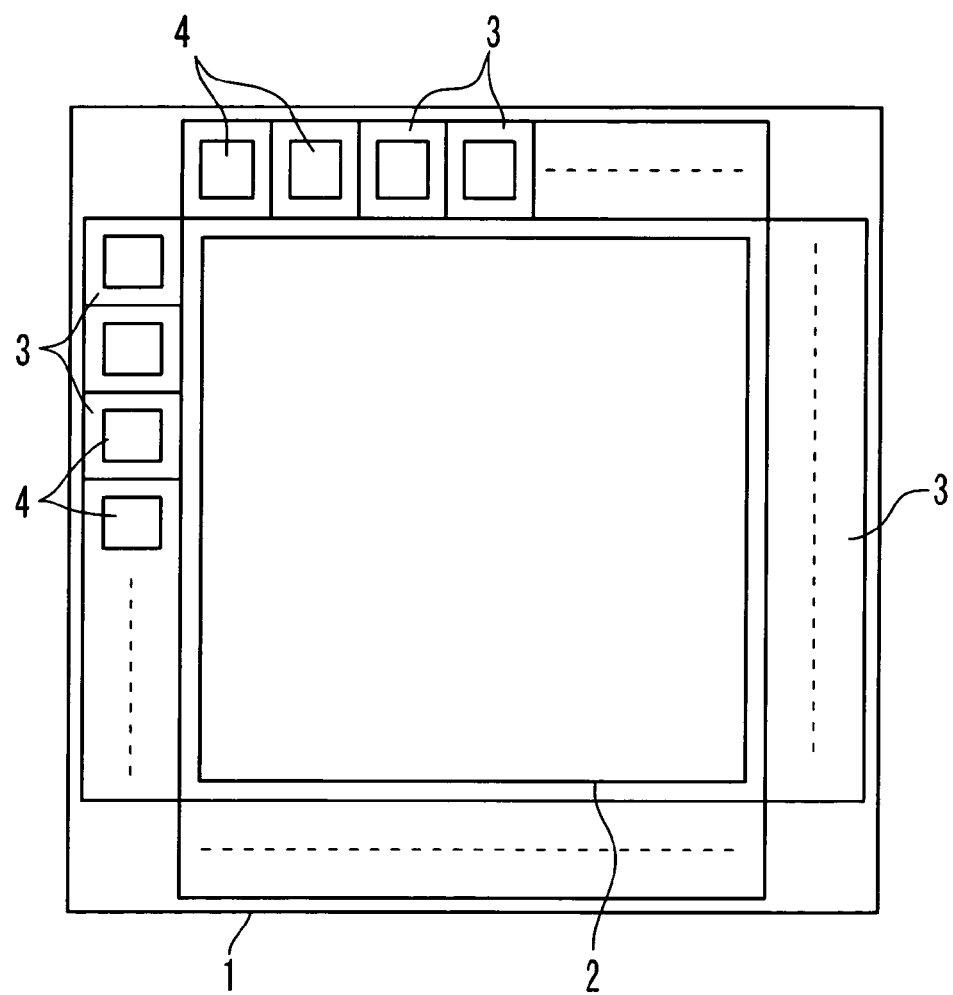
FIG. 3 is a general view of a layout of an electrode pad.

The semiconductor device according to the first embodiment of the present invention will be described with reference to FIG. 3. As shown in FIG. 3, an internal circuit 2 includes circuits such as a memory circuit and a logic circuit in a central region or an inside belt region of the semiconductor device (semiconductor chip) 1 in the first embodiment. A plurality of I/O circuit regions 3 are arranged in a frame manner in a peripheral region of the semiconductor chip 1 to surround the internal circuit 2. Electrode pads 4 are respectively provided in the plurality of the I/O circuit regions 3, and are connected with the I/O circuit regions 3 electrically. It should be noted that the "semiconductor chip" in the following description includes both kinds of semiconductor chips, that is, a semiconductor chip formed on a wafer in a state before being divided into chips, and a semiconductor chip cut out from the wafer.

Figure 4:
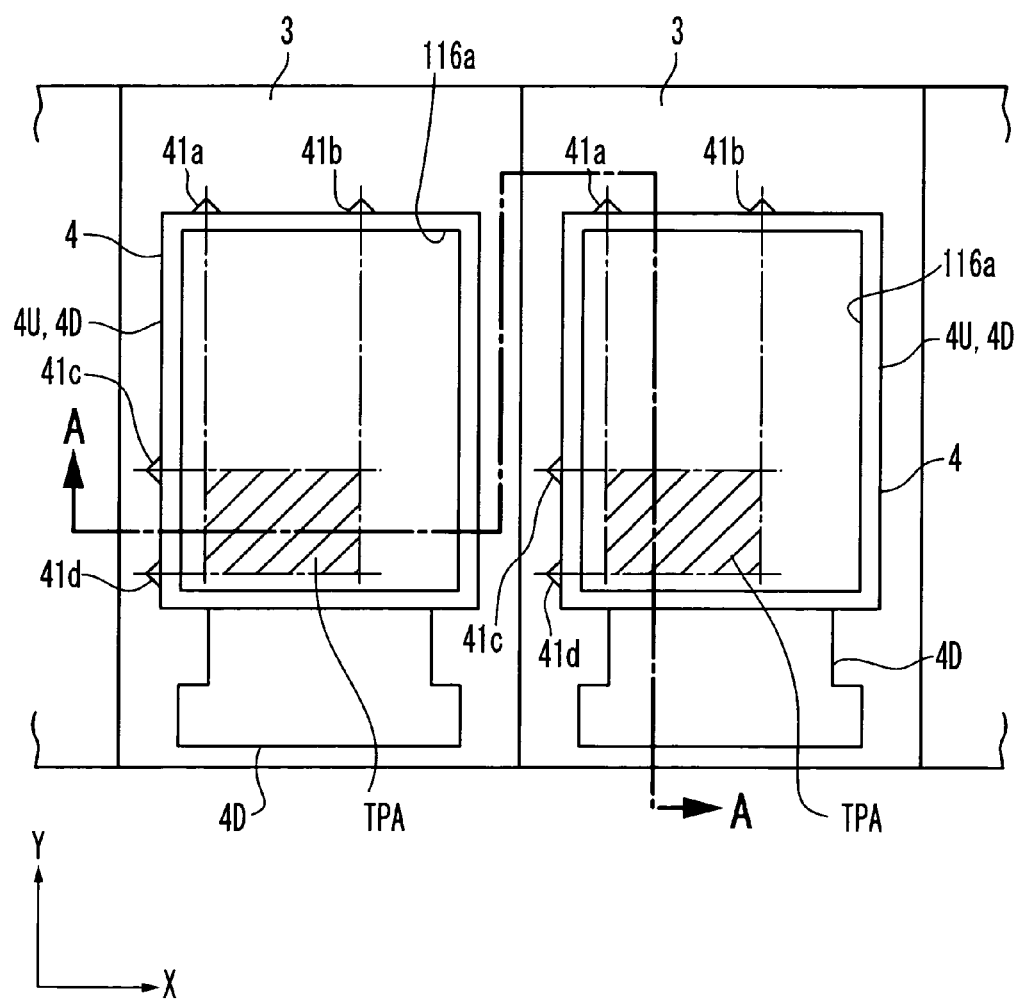
FIG. 4 is an expanded plan view of a part of I/O circuit regions including electrode pads in a semiconductor device according to a first embodiment of the present invention.
Figure 5:
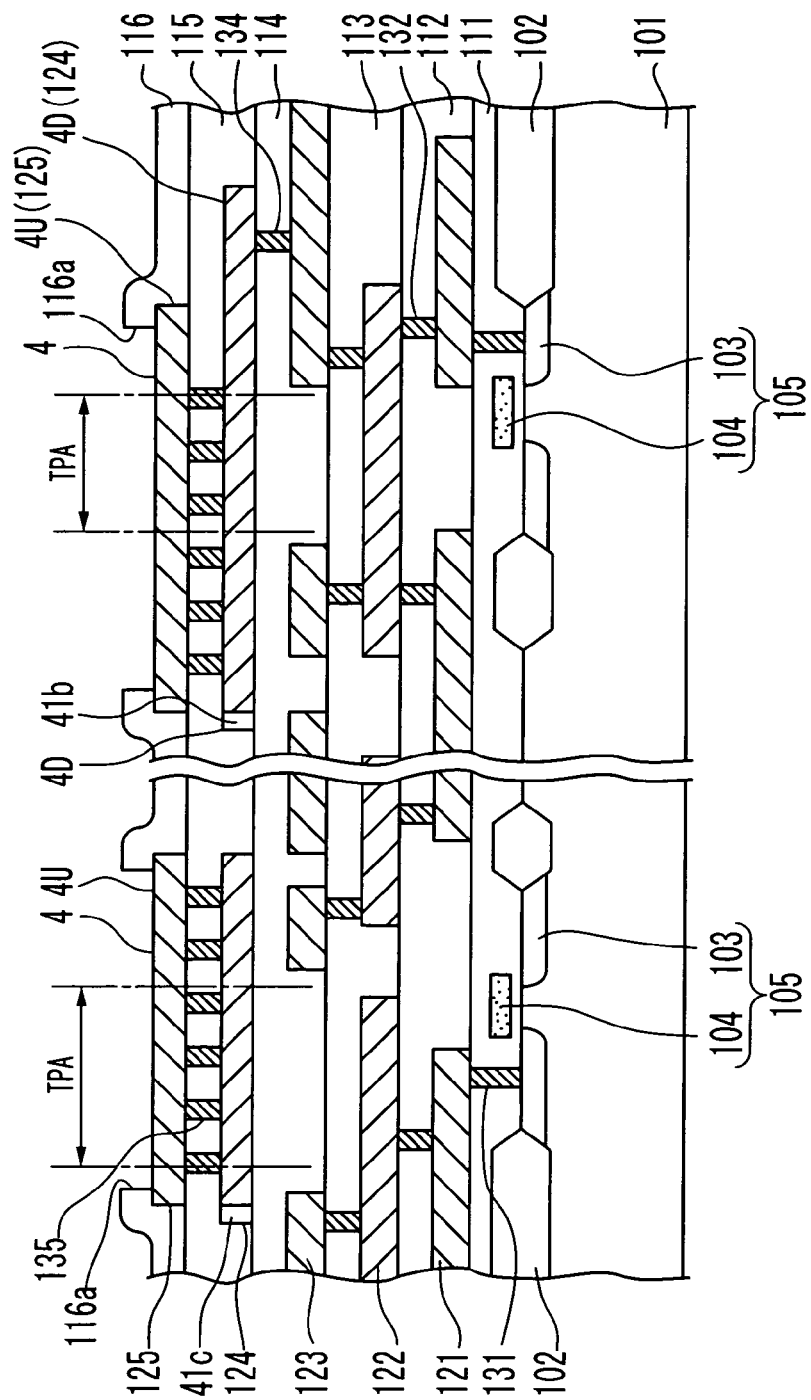
FIG. 5 is a cross sectional view of the semiconductor device of the first embodiment along A-A line in FIG. 4.

FIG. 4 is an expanded plan view of a part of the I/O circuit region 3 including the electrode pad 4. FIG. 5 is a cross sectional view of the semiconductor device along the A-A line in FIG. 4. Here, a detailed description of the semiconductor is omitted and a brief description is given. The semiconductor region is divided element regions by an insulating and isolating film 102 provided in the surface of the silicon substrate 101 as the semiconductor chip 1. An element 105 such as a MOS transistor is formed in each element region. The MOS transistor is composed of diffusion layers 103 as source/drain diffusion layers with predetermined patterns, and a polysilicon gate 104 formed above the surface of the silicon substrate 101. A first interlayer insulating film 111 is formed to cover the elements 105, and a first metal wiring layer 121 is formed on the first interlayer insulating film 111. Moreover, a second interlayer insulating film 112, a second metal wiring layer 122, a third interlayer insulating film 113, a third metal wiring layer 123, a fourth interlayer insulating film 114, a fourth metal wiring layer 124, a fifth interlayer insulating film 115, and a fifth metal wiring layer 125 are sequentially formed in this order on the first metal wiring layer 121. A surface insulating film 116 is formed to cover a part of the fifth interlayer insulating film 115. The first to fifth interlayer insulating films 111 to 115 are formed from silicon oxide films in this example. The surface insulating film 116 is formed of a resin. Moreover, the first to fifth metal wiring layers 121 to 125 include metal wiring patterns formed of aluminum. Especially, the first to third metal wiring layers 121 to 123 are formed to have predetermined wiring patterns. First to third via-contacts 131 to 133 are formed of metal such as tungsten in the first to third metal wiring layers to electrically connect between the first to fourth wiring layers and the element 105. Thus, a multi-layer interconnection structure is configured.

Figure 6:
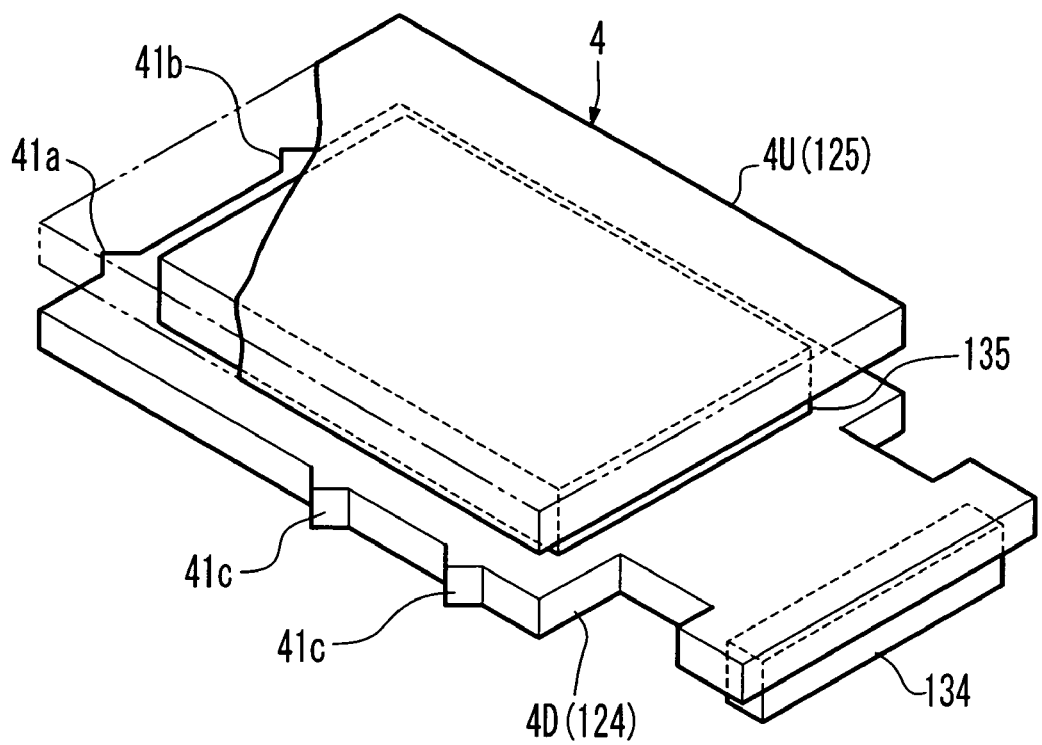
FIG. 6 is a perspective view of the electrode pad.

On the other hand, as shown in FIG. 5, the electrode pad 4 is formed as a CUP pad (Circuit Under Pad) having 2-layer structure of the fourth metal wiring layer 124 and the fifth metal wiring layer 125. The CPU pad structure has a lower layer pad 4D of the fourth metal wiring layer 124 and an upper layer pad 4U of the fifth metal wiring layer 125, which is formed directly above the lower layer pad 4D. The pads 4D and 4U are electrically connected through a fifth via-contact 135 provided in the fifth interlayer insulating layer 115 between the pads 4D and 4U. A surface of the upper layer pad 4U as a passivation layer is exposed in a rectangular opening 116a which is opened in the surface insulating layer 116. The exposed surface functions as an electrode pad that a test probe of an inspection apparatus is made to contact, and a gold fine wring as an external electrode is connected. The lower layer pad 4D is formed to have an approximately same size of as the upper layer pad 4U and to have an approximately square shape, and both of the pads overlap with each other in the vertical direction. However, a protruding section is provided for the lower layer pad 4D to extend in the direction of the inside of the semiconductor chip 1 longer than the upper layer pad 4U, as shown in FIG. 6. The lower layer pad 4D is electrically connected with the third metal wiring layer 123 by the via-contacts 134 formed in the fourth interlayer insulating layer 114. As a result, the upper layer pad 4U is electrically connected with the first to the third metal wiring layers 121 to 123 and the element 105 through the lower layer pad 4D so as to function as an external electrode to connect the element 105 electrically to an external unit.

In this way, in the CUP pad structure, the fifth interlayer insulating layer 115 is put between the lower layer pad 4D and the upper layer pad 4U, and the pads 4U and 4D are integrally connected electrically and mechanically through the fifth via-contact 135. As a result, as described later, the lower layer pad 4D is prevented from being peeled off from the fifth interlayer insulating layer 115 even when the external electrode is bounded to the upper layer pad 4U so that a pulling force is applied to the upper layer pad 4U by the external electrode. Therefore, the electrode pad can resist the pulling force. Thus, the CUP pad structure is effective to prevent the upper layer pad 4U from being peeled off from the surface of semiconductor chip 1, i.e., the surface of the fifth interlayer insulating layer 115. For this reason, the fifth via-contact 135 is formed to have a plane shape of a grid pattern so that the fifth via-contact 135 improves the connection strength of the pads 4U and 4D, although being not illustrated.

Moreover, four probe area marks 41a to 41d are formed on two sides of the lower layer pad 4D. One side is an external side along the outer side of the semiconductor chip 1, and the other is an adjacent side orthogonal to the external side. Each of the probe area marks 41a to 41d is formed as an isosceles triangle with a top. The probe area marks 41a, 41b, 41c, and 41d are arranged as pairs on the above-mentioned two sides of the lower layer pad 4D in predetermined intervals, respectively. These probe area marks 41a to 41*d* are visible through the fifth interlayer insulating layer 115 and the surface insulating layer 116 covering the lower layer pad 4D when the layer pad 4 is observed from the surface of the semiconductor chip 1 by eyes of an operator or a picturing apparatus. These probe area marks 41*a* to 41*d* are provided to define a test probe area TPA which is surrounded by a pair of virtual lines passing through the tops of the marks 41*a* and 41*b* and extending along the orthogonal side and a pair of virtual lines passing through the tops of the marks 41*c* and 41*d* and extending along the external side, as shown in FIG. 4 by a fine chain lines.

As show in FIG. 5, the metal wiring layers 121 to 123 of the 3-layer structure are provided directly under the electrode pad 4 to form the I/O circuit region 3. It should be noted that the third metal wiring layer 123 as the uppermost wiring layer is not provided directly under the test probe area TPA defined by the probe area marks 41*a* to 41*d*. That is, the third metal wiring layer 123 is provided only in a region other than the region directly under the test probe area TPA. The second metal wiring layer 122 and first metal wiring layer 121 does not almost receive influence of a crack CX generated on the contact of the test probe, and therefore, can be provided in the region directly under the test probe area TPA.

Hereinafter, a manufacturing method of the semiconductor chip with above-mentioned structure and an electrical inspection method thereof will be described in detail. As shown in FIG. 7A, at the electrical inspection of the semiconductor chip 1, a test probe TP of the electrical inspection apparatus is electrically made to contact the surface of the electrode pad 4. Thus, the semiconductor chip 1 is supplied with electric power and test signals through the test probes TP. At this time, the operator observes the probe area marks 41*a* to 41*d* of the electrode pad 4 to identify the test probe area TPA defined by the probe area marks 41*a* to 41*d*, and then determines the position of the test probe TP in the test probe area TPA. Otherwise, an automatic machine identifies the probe area marks 41*a* to 41*d* and the test probe area TPA automatically, and then determines the position of the test probe TP automatically. Therefore, the stress where the test probe TP is made to contact the surface of the electrode pad 4 is only applied to the region directly under the test probe area TPA. Also, as shown in FIG. 7B, a contact flaw (probe trace) PX generated when the test probe TP is pushed against the surface of the electrode pad 4 is limited to only the test probe area TPA. The limitation is similar even if the test probe TP is pushed against the same electrode pad 4 plural times.

Figure 1:
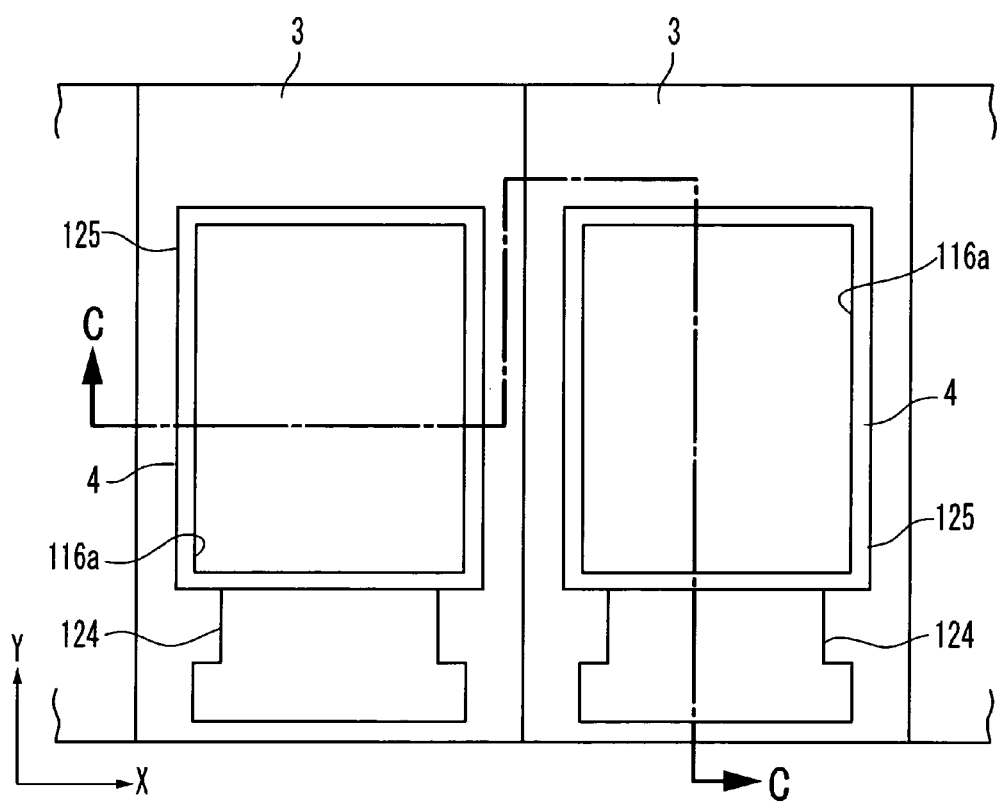
FIG. 1 is a diagram showing an outline layout of an electrode pad in a conventional semiconductor device.

Consequently, even when a crack is generated in the region directly under the electrode pad 4 due to pushing the test probe TP of the electrical inspection against the electrode pad 4, the crack is limited to only the region directly under the test probe area TPA. The third metal wiring layer 123 as an uppermost layer, which is easily influenced by crack, is not provided in the region directly under the test probe area TPA. Therefore, the third metal wiring layer 123 is never damaged in the electrical inspection. Moreover, the stress upon the pushing the test probe TP hardly influences the second lower layer 122 and the first metal wiring layer 121. Therefore, these metal wiring layers also receives no damage. As a result, leakage due to the electrical inspection in the metal wiring layers of the I/O circuit region 3 can be prevented and the reliability of the metal wiring layer is secured. In other words, the third metal wiring layer 123 as the uppermost wiring layer can be widely provided in an extended region, i.e., a region other than the test probe area TPA even when the region is directly under the electrode pad 4. As the result of the extended region, design flexibility of the third metal wiring layer 123 is improved, and high-integration of the metal wiring layers can be accomplished. FIG. 8B shows a wiring region of the conventional electrode pad shown in FIG. 1. FIG. 8A shows a wiring region when the I/O circuit region 3 and the electrode pad 4 of the present invention are applied to FIG. 8B to have the same size. In FIGS. 8A and 8B, the wiring possible regions are shown as pointed regions. As understood from FIGS. 8A and 8B, the extended region for the third metal wiring layer 123 can be provided on the both sides of the test probe area TPA, compared with the conventional wiring region shown in the FIG. 8B.

In this way, it becomes possible to extend the wiring possible region 3M in the X direction to connect an outer region 3O as well as an inner region 3I along the Y direction in the I/O circuit region 3 since it is possible to extend the wiring possible region for the third metal wiring layer 123 up to the region along both sides of the electrode pad 4 in the I/O circuit region 3. Therefore, the electrical resistance of the wiring in the regions can be decreased to make it possible to speed up of the operation of the semiconductor chip.

Moreover, the test probe area TPA is limitedly defined in the electrode pad 4 as for the Y direction in the first embodiment. The wiring possible region of the I/O circuit region 3 can be provided also in a region other than the region directly under the test probe area TPA in the electrode pad 4 as well as the case in the X direction. Therefore, the wiring possible region can be extended in the Y direction wider than the conventional electrode pad.

When the semiconductor chip 1 is determined to be non-defective through the electrical inspection, an external electrode (bonding wire) BW such as a gold fine wire is bonded to the electrode pad 4, as shown in FIG. 7B. At this time, the bonding wire BW is bonded to a region other that the test probe area TPA in the electrode pad 4. It is possible to observe the probe area marks 41*a* to 41*d* to identify the test probe area TPA for the bonding. However, in general, a wire-bonding apparatus automatically identifies the probe area marks 41*a* to 41*d*. Also, when the gold fine wire is bonded to the electrode pad formed of aluminum, aluminum and gold are alloyed by using supersonic wave energy in the bonding. In this way, even when the contact flaw PX by the probe is generated on the surface of the electrode pad 4 through the electrical inspection, the bonding is carried out on the region other than the test probe area TPA where does not interference with the contact flaw PX by the probe. Thus, a defective bonding due to the contact flaw PX by the probe can be prevented previously and high reliability of bonding can be achieved. Moreover, if the contact flaw PX by the probe is generated on the outside of the test probe area TPA, the semiconductor chip 1 can be determined to be a defect, since the reliability of bonding of the gold fine wire is reduced.

Here, the reason why the probe area marks 41*a* to 41*d* are formed on the lower layer pad 4D in the first embodiment will be described below. The electrode pad of the semiconductor chip 1 is formed on the uppermost layer of the semiconductor substrate. The resin layer of a material such as polyimide is formed as a surface insulating layer. The resin layer contracts easily through temperature change, and the contraction causes a stress on the electrode pad in the direction of the plane, which moves the electrode pad on the surface of the semiconductor chip. Therefore, as shown in FIG. 4, if the probe area marks 41*c* and 41*d* are formed as protrusions on the side of the upper layer pad 4U facing to an adjacent pad 4U when a plurality of the electrode pads are arranged in a minute interval, the probe area marks 41c and 41d will contact the adjacent upper layer pad 4U upon the movement of the upper layer pad 4U due to the contraction. As a result, a leakage is caused. On the other hand, the lower layer pad 4D does not contact the resin layer as the surface insulating layer, and is hardly moved with the contraction stress. As a result, the lower layer pad 4D never causes the leakage even if the probe area marks 41c and 41d are formed on the adjacent side facing each other Consequently, in the present invention, when the adjacent pads are arranged apart from each other in an enough interval to an extent that the leakage is not caused by the probe area marks 41c and 41d even if each electrode pads 4 are moved, the probe area marks 41a to 41d can be formed on the upper layer pad 4U. It does not need to say that the probe area marks 41a to 41d can be formed on the upper layer pad 4U when the semiconductor chip is designed so as to prevent the upper layer pad 4U from moving. In any cases, the probe area marks formed on the upper layer pad can be observed and confirmed easier from the surface of the semiconductor chip, compared with the case where these marks are formed on the lower layer pad.

Second Embodiment

The present invention has been applied to the semiconductor chip with the electrode pad having the CUP structure in the first embodiment. In the semiconductor device according to the second embodiment, the present invention is applied to the semiconductor chip with the electrode pad of a single metal wiring layer. That is, the present invention can be applied to such the semiconductor chip that an electrode pad cannot be peeled off from the surface of the semiconductor chip of the single layer structure even when a pulling stress is applied through an external electrode.

Figure 2:
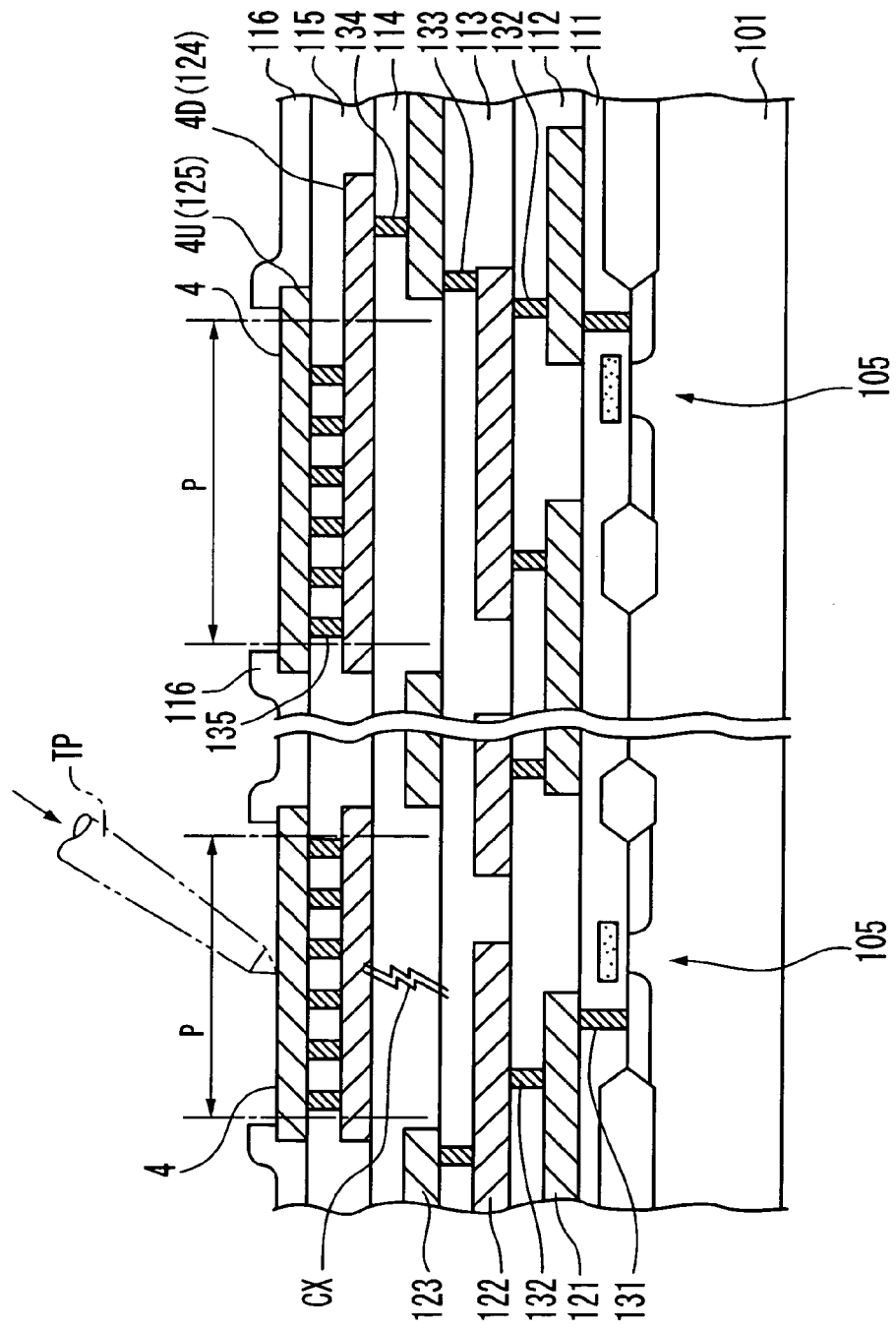
FIG. 2 is a schematic cross sectional view of a conventional semiconductor device along C-C line in FIG. 1.
Figure 9:
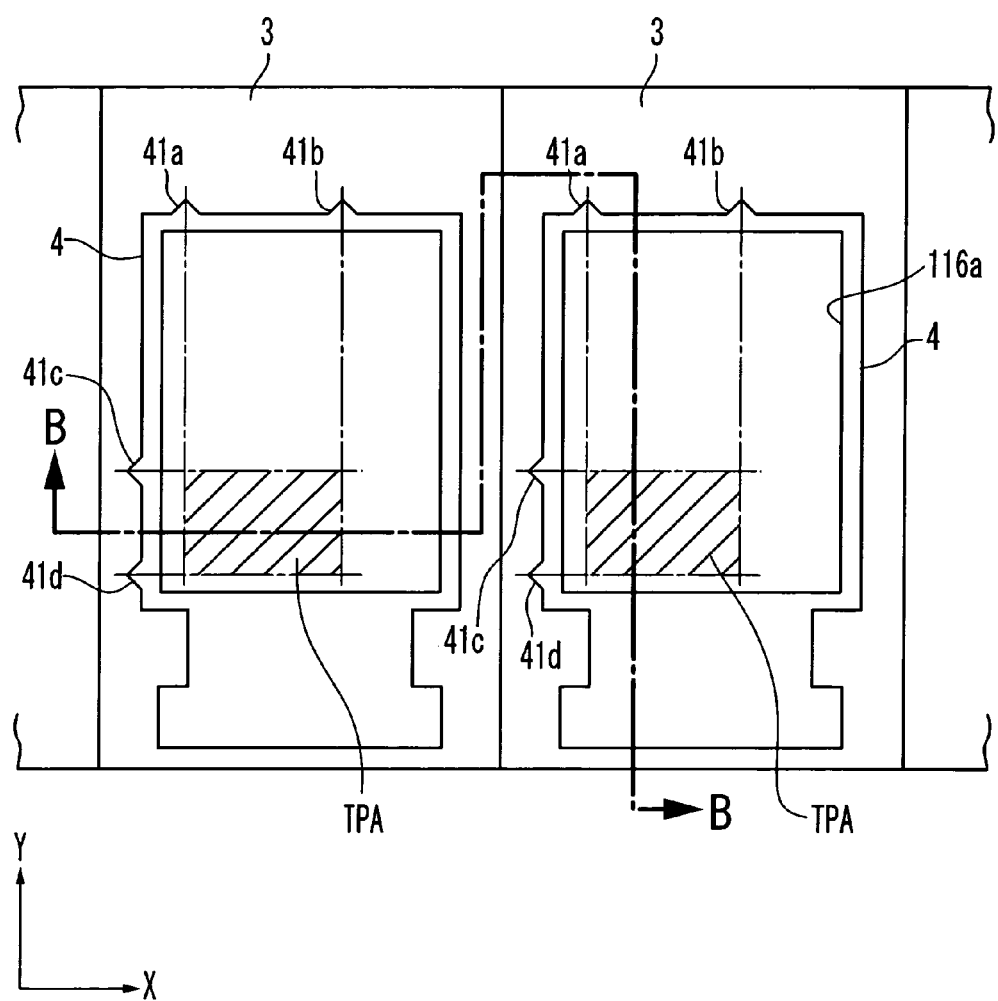
FIG. 9 is an expanded plan view of a part of I/O circuit regions including electrode pads in the semiconductor device according to a second embodiment of the present invention.
Figure 10:
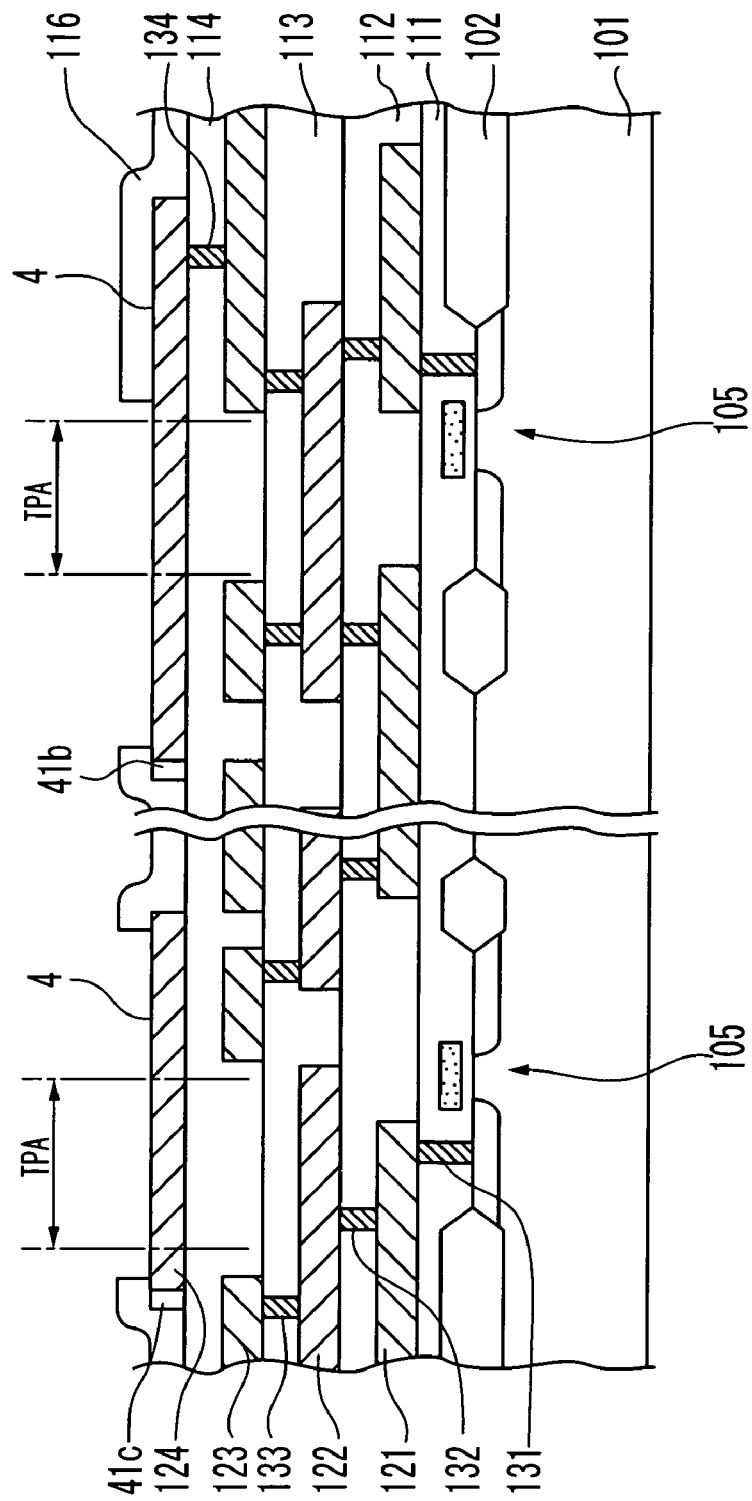
FIG. 10 shows a cross sectional view of the semiconductor chip of the second embodiment along the B-B line in FIG. 9.

FIG. 9 shows a layout outline of the electrode pads in the semiconductor device according to the second embodiment of the present invention. FIG. 10 shows a cross sectional view of the semiconductor chip along the B-B line in FIG. 9. In FIGS. 9 and 10, the same components as FIGS. 2 and 3 are allocated with the same reference numerals and the description of them are omitted. In the second embodiment, the electrode pad 4 is formed as a single layer of the fourth metal wiring layer 124, and the fifth metal wiring layer does not exist. The opening 116a is provided in the surface insulating layer 116 covering the electrode pad 4. The region of the fourth metal wiring layer 124 exposed by the opening 116a is an electrode pad area. The fourth metal wiring layer 124 is electrically connected with the third metal wiring layer 123 through the fourth via-contact 134 formed in a portion of the electrode pad 4 covered by the surface insulating layer 116.

Moreover, four probe area marks 41a to 41d in total are formed, that is, a pair of the marks 41a and 41b are formed on an external side of the electrode pad 4 along the outer circumference of the semiconductor chip 1 and a pair of the marks 41c and 41d are formed on an orthogonal side to the external side. Like the probe area marks 41a to 41d in the first embodiment shown in FIG. 4, each of the probe area marks 41a to 41d in the second embodiment is formed as an isosceles triangle having a top. These probe area marks 41a to 41d define a test probe area TPA. Also, the third metal wiring layer 123 as the uppermost layer among the wiring layers 121 to 123 directly under the electrode pad 4 is not provided directly under the defined test probe area TPA in an I/O circuit region 3 directly under the electrode pad 4. The third metal wiring layer 123 is provided in a region other than the test probe area TPA.

The electrical inspection method and the manufacturing method of the semiconductor chip in the second embodiment are the same as those of the first embodiment and the description thereof are omitted. As shown in FIG. 7A, a crack is limited to only the region directly under the test probe area TPA even when the crack is generated in directly under the electrode pad 4 due to the stress applied through the contact of the test probe TP and the electrode pad 4 in the electrical inspection. Also, the third metal wiring layer 123 does not exist directly under the test probe area TPA. Therefore, the third metal wiring layer 123 receives no damage in the electrical inspection. Moreover, the stress hardly influences the second lower layer 122 and the first metal wiring layer 121. Therefore, these metal wiring layers also receives no damage. As a result, leakage in the metal wiring layers of the I/O circuit region 3 can be prevented beforehand in the electrical inspection and the reliability of the metal wiring layer is secured. Therefore, the third metal wiring layer 123 as an uppermost layer can be widely provided up to an extended region other than the test probe area TPA even in the region directly under the electrode pad 4, as well as in the first embodiment. As a result, design flexibility is improved in the arrangement of the third metal wiring layer 123, and high-integration of the metal wiring layer is achieved.

Next, an external electrode (bonding wire) BW such as a gold fine wire is bonded to the electrode pad 4 of the semiconductor chip 1 determined as a non-defective product through the electrical inspection. At this time, as shown in FIG. 7B, the bonding of the bonding wire BW to the electrode pad 4 is carried out in the region other than the test probe area TPA. Therefore, the bonding can be carried out on the position without interference with the contact flaw PX even if the contact flaw PX is generated on the surface of the electrode pad 4 through the electrical inspection. Thus, a defective bonding caused by the contact flaw PX can be prevented beforehand and high reliability of bonding can be achieved.

Figure 11:
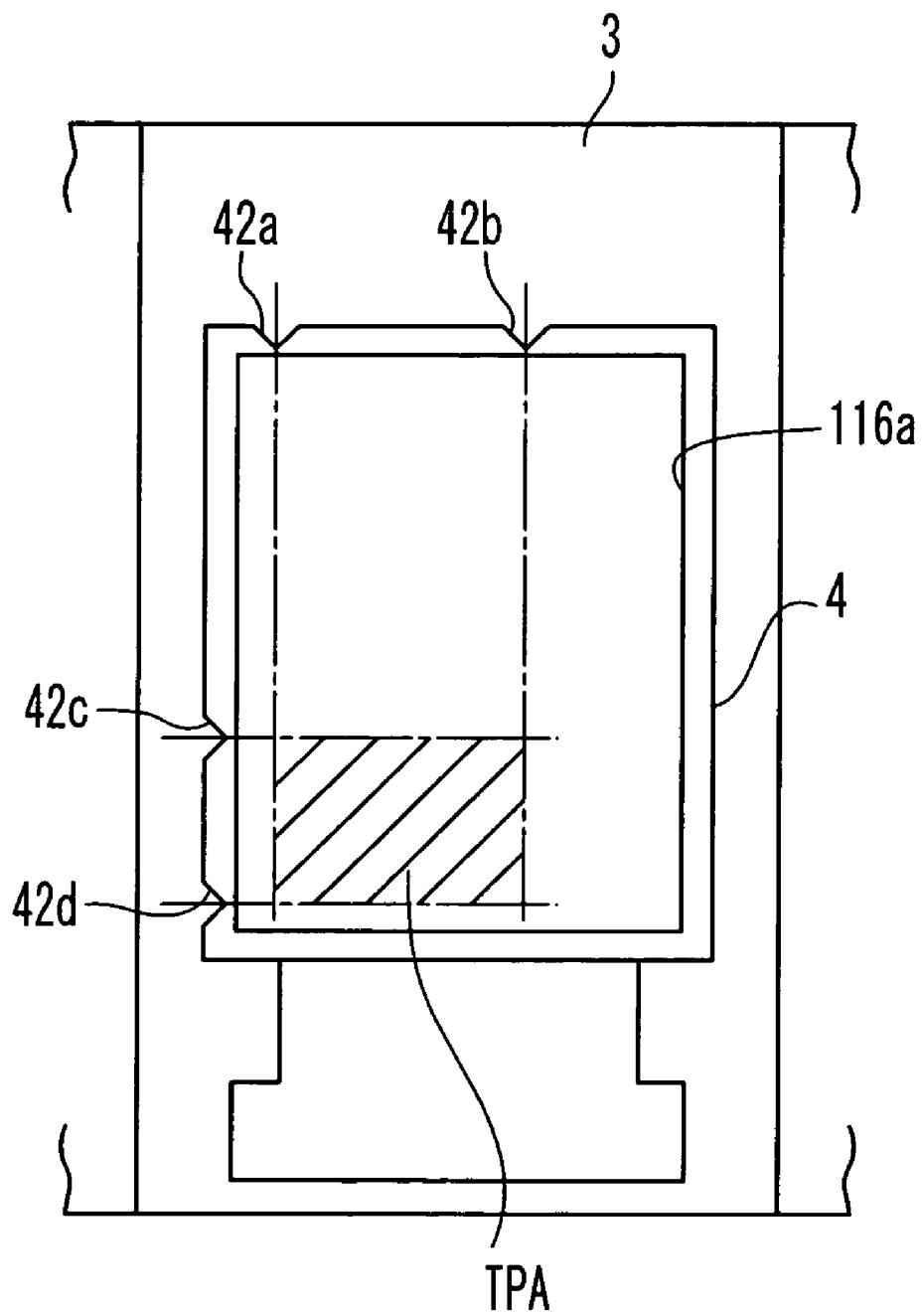
FIG. 11 is an expanded view showing the electrode pad in a first modification of the present invention.

The second embodiment is preferably applied to the semiconductor chip with somewhat large interval between the adjacent electrode pads 4, since the probe area mark might contact the adjacent pad when the electrode pad 4 is moved by the resin layer as the surface insulating layer 116. Also, even if a distance between the adjacent electrode pads 4 is small, the leakage can be prevented without the substantial distance between the electrode pads 4, if the probe area marks are formed as triangle cuts 42a to 42d, as shown in FIG. 11. The electrode pad 4 is formed as a single layer in the second embodiment and the pad is not a laminate layer of the upper and lower layer as in the first embodiment. Therefore, the probe area marks 42a to 42d can be visually or automatically recognized from the surface of the semiconductor chip 1.

As mentioned above, the probe area marks are formed integrally with the electrode pads in both of the first and second embodiments. The probe area mark can be simply manufactured by adding a pattern corresponding to the probe area mark to a part of a mask pattern for the exiting electrode pad in a photolithography technique. Therefore, the manufacturing process and cost are not increased compared with the conventional semiconductor device.

Figure 12:
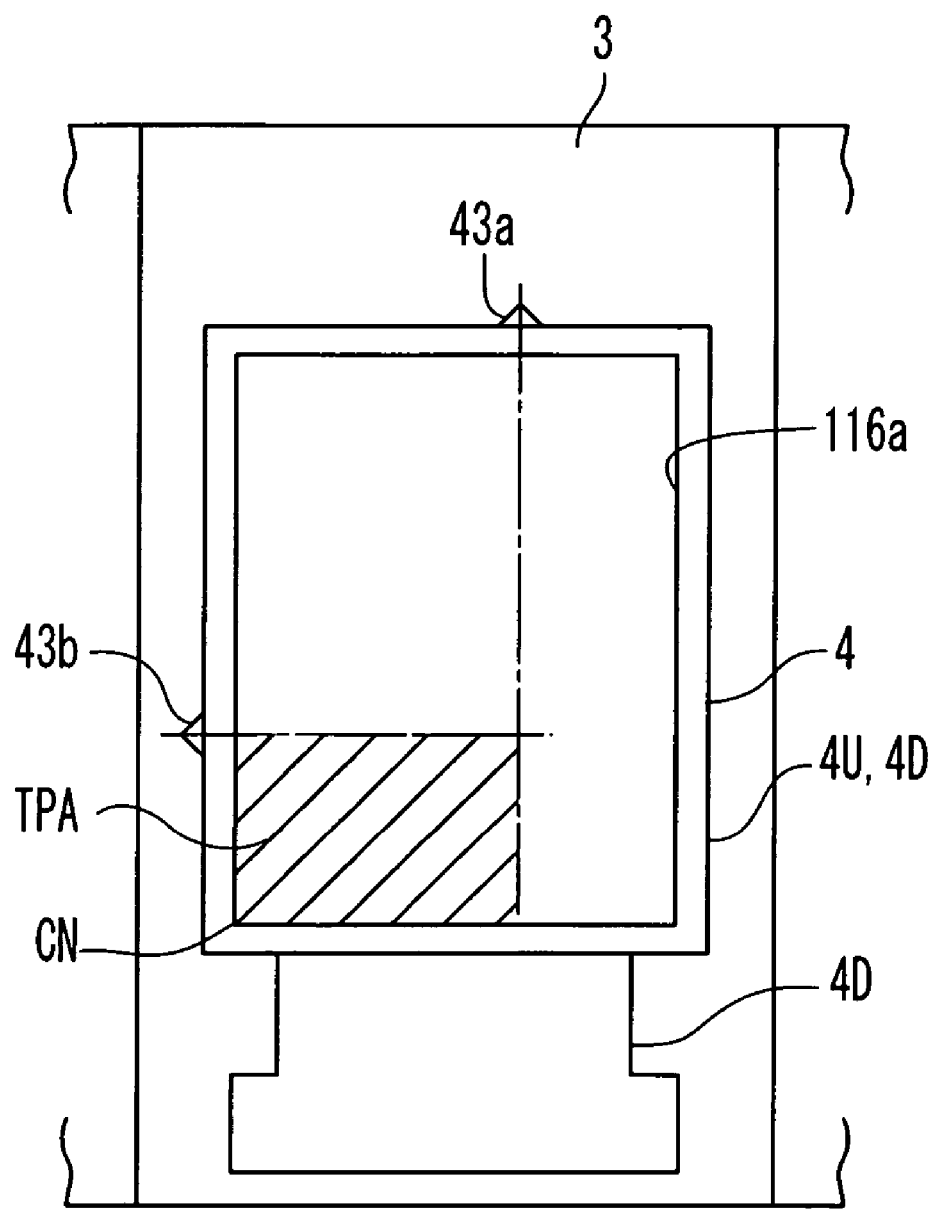
FIG. 12 is an expanded view showing the electrode pad in a second modification of the present invention.

The probe area marks of the present invention are not necessarily limited to the configurations in the first and second embodiments if a predetermined region of the surface of the electrode pad can be recognized. For instance, a second modified example is also applicable as shown in FIG. 12. In the second modified example, the probe area marks 43a and 43b are respectively provided on the external side and the orthogonal side of the electrode pad 4. In this case, a region surrounded by virtual lines passing through the probe area marks 43a and 43b, and passing through a corner CN of the electrode pad 4 the is recognized as the test probe area TPA.

Figure 13:
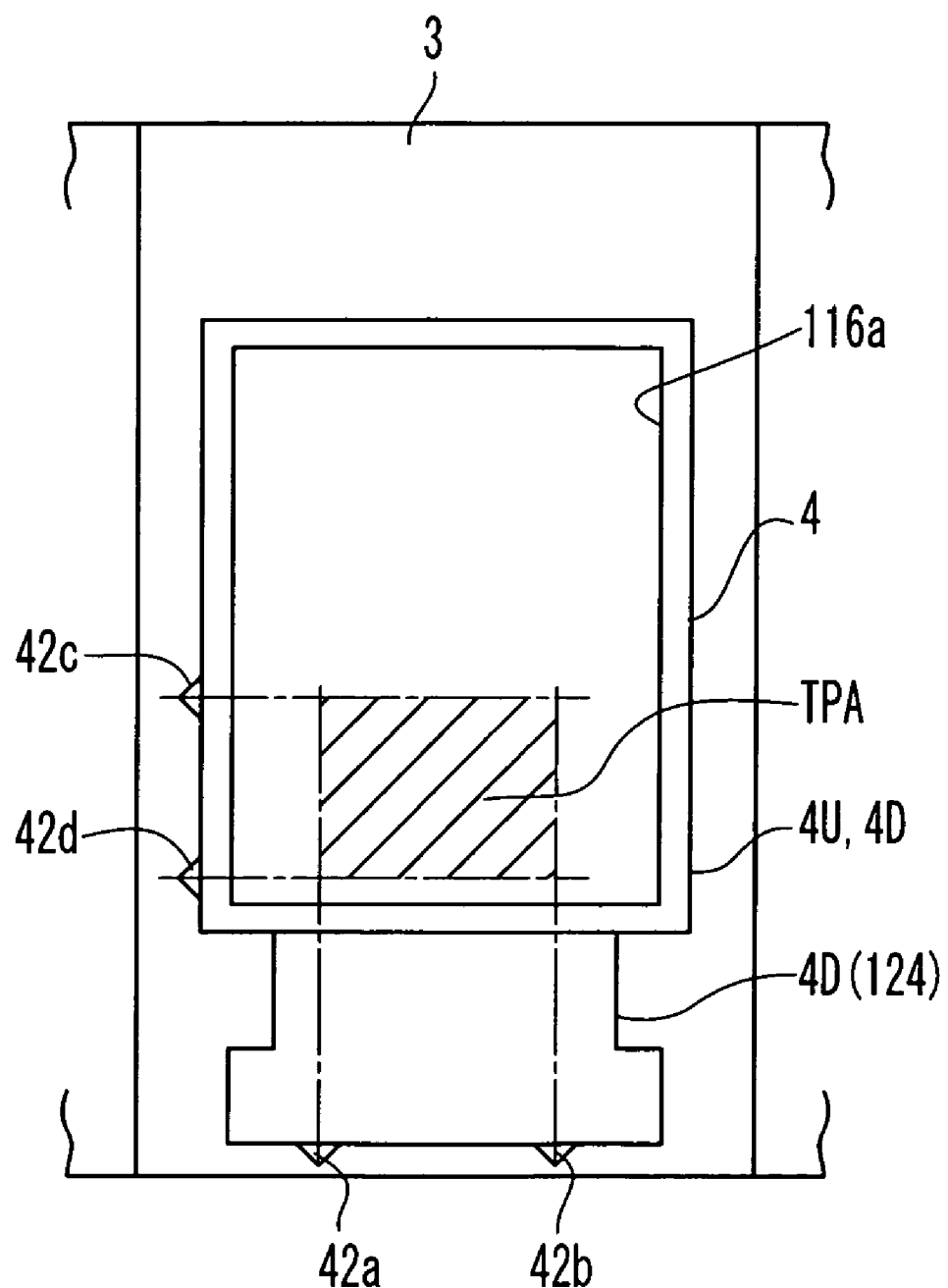
FIG. 13 is an expanded view showing the electrode pad in a third modification of the present invention.

In addition, it is more effective to recognition of the test probe area TPA with high accuracy that probe area marks are provided on the positions as near to the test probe area TPA as possible. Therefore, in a third modified example shown in FIG. 13, the probe area marks 42a and 42b which are arranged on the external side of the electrode pad 4 in the first embodiment are provided on the nearest side to the test probe area TPA, that is, on the internal side of the lower layer pads 4D as the fourth metal wiring layer 124.

Figure 14:
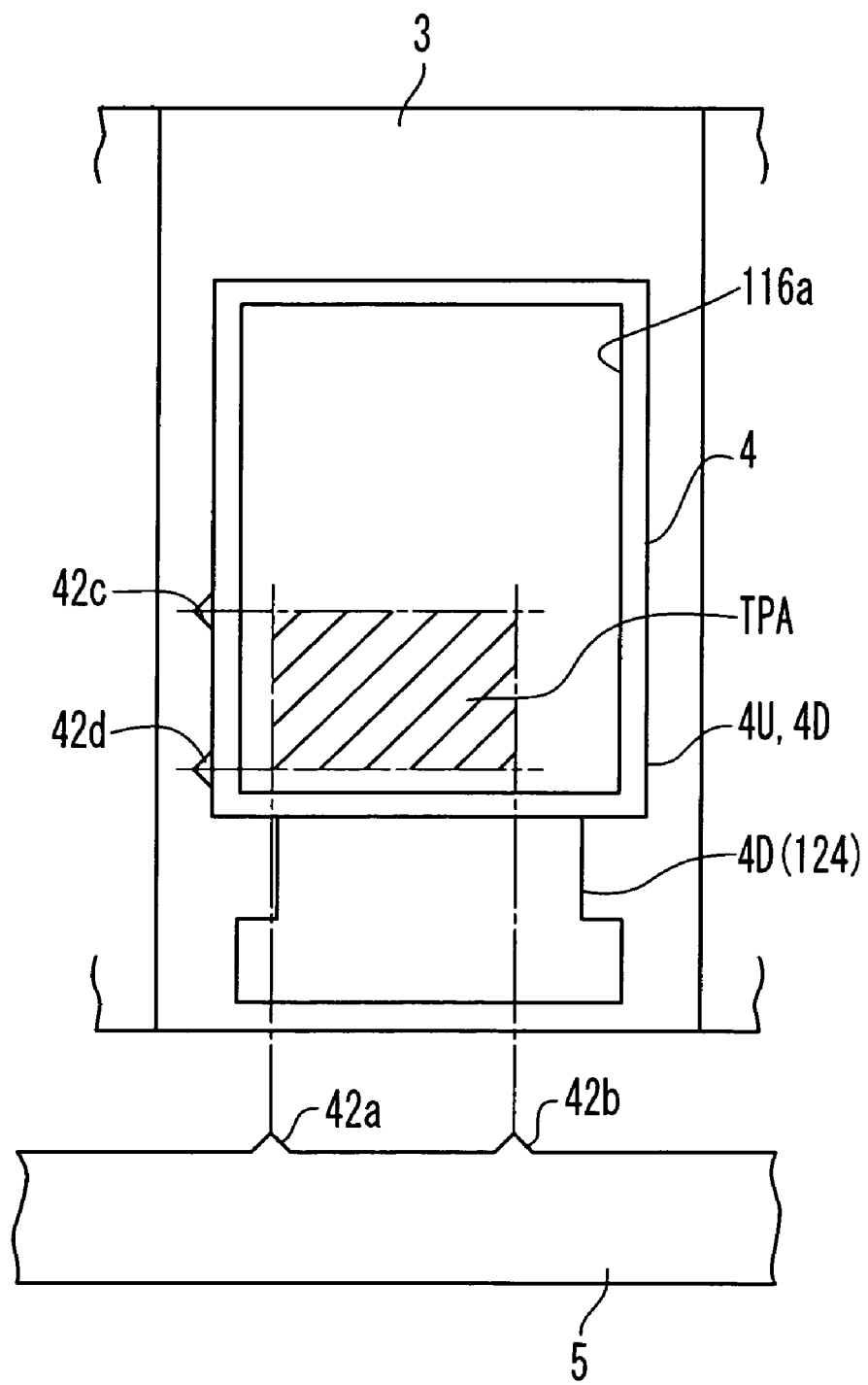
FIG. 14 is an expanded view showing the electrode pad in a fourth modification of the present invention.

Further, in a fourth modified example shown in FIG. 14, the probe area mark 42a and 42b are not provided on the side of the electrode pad 4 or the fourth metal wiring layers 124 connected with the electrode pad 4. In the fourth modified example, the probe area mark 42a and 42b are provided one side of a wiring 5, which is formed as another part in the fourth metal wiring layer 124. As a result, the space to provide the probe area marks in the circumference of the electrode pad 4 can be decreased.

Figure 15:
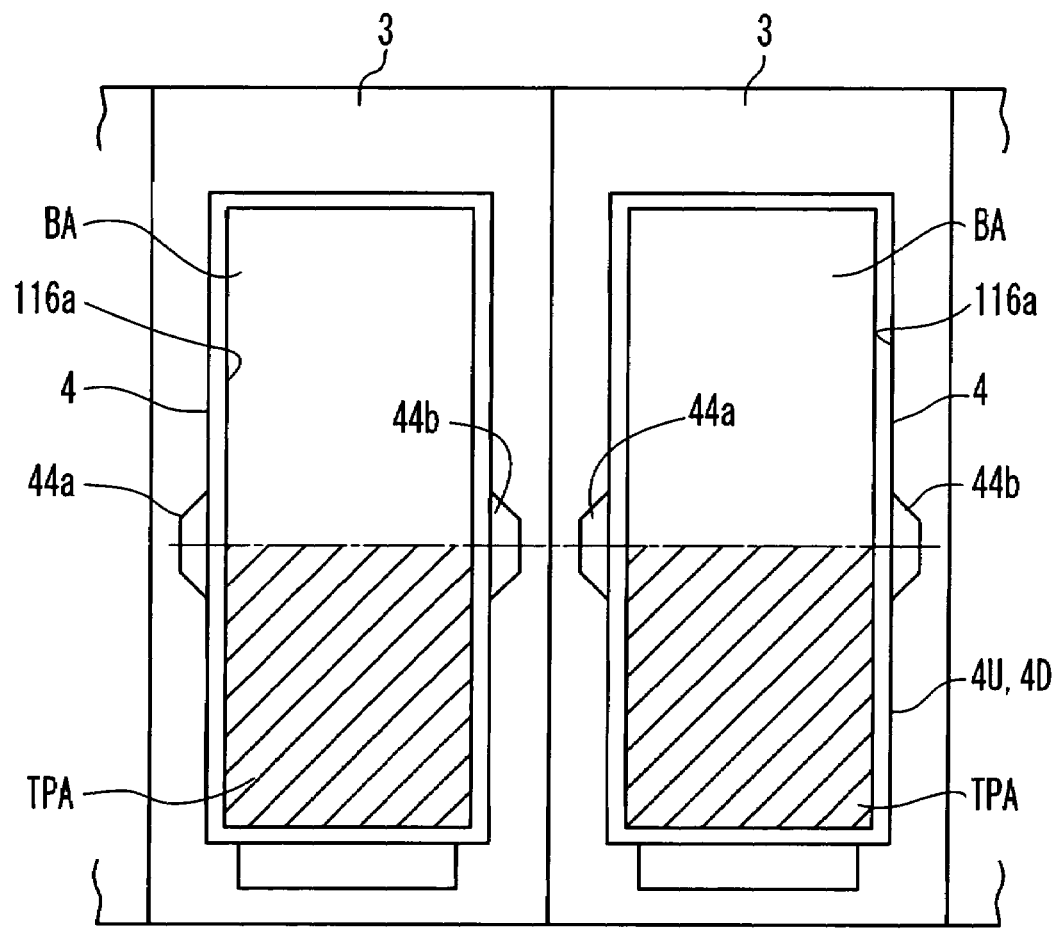
FIG. 15 is an expanded view showing the electrode pad in a fifth modification of the present invention.

Furthermore, a fifth modified example shown in FIG. 15, the probe area marks 44a and 44b are provided on the both orthogonal sides of the electrode pad 4 to be oppose to each other when the electrode pad 4 is formed in a long and slender rectangle. A region of the electrode pad 4 is divided by a line passing through the probe area mark 44a and 44b. As a result, one area is defined as the test probe area TPA, and the other is defined as a bonding area BA for an external electrode. The fifth modified example is effective in case that the area ratio of the area of the test probe area TPA to the area of the electrode pad 4 is large when the size of the electrode pad is made small, as shown in FIG. 15. Moreover, the probe area mark 44a and 44b are formed as trapezoid in the fifth modified example, which is applicable to the above embodiments and above modified examples. A virtual line across the middle point of the trapezoid divides the test probe area TPA and the bonding area BA.

In this way, in the semiconductor device of the present invention, an electrode pad may be formed of two laminated layers of an upper layer pad and a lower layer pad. A probe area mark is provided on the lower layer pad. The probe area mark is formed to be visible from the surface of the semiconductor device. An interlayer insulating layer is provided between the upper layer pad and the lower layer pad. In this case, it is preferable that the both pads are connected mechanically and electrically by the via-contact provided to pass through the interlayer insulating layer. A circuit under the electrode pad has the wiring layers having more than one layer, and the wiring layer as an uppermost layer of the wiring layers is not provided directly under the test probe area. Moreover, an external electrode can be bonded to the upper layer pad. The external electrode is bonded to the region that comes off from the test probe area. Otherwise, the electrode pad is formed as a single layer pad, and the probe area mark is provided on the pad.

It is possible to easily recognize the contact region of the electrode pad with the test probe in the electrical inspection by the probe area marks. The region where the crack and the contact flaw are generated can be limited by the limitation of the contact region on the surface of the electrode pad. By avoiding the crack and the contact flaw in the execution of the wiring or bonding, it is possible to improve the bonding reliability of the electrode pad. Especially, in an electrode pad having the configuration in which the external electrode is bonded after the contact of the test probe with one electrode pad, a part of the region of the electrode pad is defined as the test probe region. Thus, it is possible to clearly distinguish the bonding region for a following process. Moreover, it becomes easy to determine the product as defective when the contact flaw comes off the region by recognizing the contact flaw based on the probe area marks after the test. Also, it is possible to manufacture the semiconductor device with high reliability. Further, the circuit wiring can be provided right under the region other than the region defined by the probe area mark. Then, it is possible to highly integrate the wiring by enlarging the possible region for wiring in the circuit wiring right under the electrode pad.

What is claimed is:

1. A semiconductor device comprising a plurality of I/O regions provided in a peripheral region of said semiconductor device,
   wherein each of said plurality of I/O regions comprises an electrode pad,
   said electrode pad has a test probe area and a bonding area which are separately provided, and
   a test probe is made to contact said test probe area and an external electrode is connected to said bonding area, and
   said test probe area is defined based on probe area markers that are protrusions extending in a direction from said electrode pad to an adjacent said electrode pad.

2. The semiconductor device according to claim 1, wherein said electrode pad has a 2-layer structure of an upper pad and a lower pad connected with said upper pad.

3. The semiconductor device according to claim 2, wherein said probe area markers are provided for said lower pad.

4. The semiconductor device according to claim 3, wherein two of said probe area markers are provided for a specific side of said lower pad opposing to an external side of said semiconductor device, and two of said probe area markers are provided for one of sides of said lower pad orthogonal to said specific side.

5. The semiconductor device according to claim 1, wherein said probe area markers are visible from above said semiconductor device.

6. A semiconductor device, comprising:
   a plurality of I/O regions in a peripheral region of the semiconductor device;
   an electrode pad in each of said plurality of I/O regions, said electrode pad having a bonding area and a test probe area entirely within said bonding area; and
   two pairs of probe area markers that define said test probe area, one of said two pairs being outside a first peripheral side of said bonding area and a second of said two pairs being outside a second peripheral side of said bonding area orthogonal to said first peripheral side, each of said two pairs including two spaced apart marks that are respectively distinguishable from said first and second peripheral sides.

7. The device of claim 6, wherein said test probe area is closer to said first peripheral side than a third peripheral side of said bonding area opposite said first peripheral side and is closer to said second peripheral side than a fourth peripheral side of said bonding area opposite said second peripheral side.

8. The device of claim 6, wherein said electrode pad comprises an upper pad layer and a lower pad layer that are electrically connected to each other, wherein said lower pad layer has an extension that extends outside of said first peripheral side of said bonding area, and wherein said one of said two pairs is outside a distal peripheral edge of said extension.

9. A semiconductor device, comprising:

a plurality of I/O regions provided in a peripheral region of the semiconductor device, wherein, each of said plurality of I/O regions comprises an electrode pad, said electrode pad has a test probe area and a bonding area, the test probe area and the bonding area being separately provided, with a test probe made to contact said test probe area and an external electrode connected to said bonding area, said test probe area is defined based on probe area markers, and said probe area markers are protrusions that are a part of said electrode pad.

* * * * *